United States Patent
Cuffney et al.

(10) Patent No.: US 9,715,420 B2
(45) Date of Patent: *Jul. 25, 2017

(54) STRING DATAFLOW ERROR DETECTION

(71) Applicant: International Business Machines Corporation, Armonk, NY (US)

(72) Inventors: James R. Cuffney, Poughkeepsie, NY (US); Timothy J. Koprowski, Newburgh, NY (US); John G. Rell, Jr., Saugerties, NY (US); Patrick M. West, Jr., Waukesha, WI (US)

(73) Assignee: International Business Machines Corporation, Armonk, NY (US)

(*) Notice: Subject to any disclaimer, the term of this patent is extended or adjusted under 35 U.S.C. 154(b) by 305 days.

This patent is subject to a terminal disclaimer.

(21) Appl. No.: 14/601,337

(22) Filed: Jan. 21, 2015

(65) Prior Publication Data

US 2016/0211850 A1    Jul. 21, 2016

(51) Int. Cl.
*G06F 7/02*    (2006.01)
*H03M 13/00*    (2006.01)
(Continued)

(52) U.S. Cl.
CPC .......... *G06F 11/079* (2013.01); *G06F 11/073* (2013.01); *G06F 11/0727* (2013.01);
(Continued)

(58) Field of Classification Search
CPC .. G06F 11/079; G06F 11/073; G06F 11/0751; G06F 11/0727; G06F 11/1048; G06F 17/16; H03K 19/20; H04L 49/555
See application file for complete search history.

(56) References Cited

U.S. PATENT DOCUMENTS

| 4,012,627 A | * | 3/1977 | Antoniak | G01S 7/2927 342/378 |
| 4,516,202 A | * | 5/1985 | Kadowaki | G06F 13/122 700/90 |

(Continued)

FOREIGN PATENT DOCUMENTS

| EP | 1310879 A2 | 5/2003 |
| EP | 1870829 A1 | 12/2007 |

(Continued)

OTHER PUBLICATIONS

Cuffney et al., "String Dataflow Error Detection", U.S. Appl. No. 14/982,005, filed Dec. 29, 2015, pp. 1-28.

(Continued)

*Primary Examiner* — Guerrier Merant
(74) *Attorney, Agent, or Firm* — Steven F. McDaniel (57) ABSTRACT

An apparatus for comparing strings comprises a first and a second set of input registers, a matrix of comparator circuits wherein rows of the matrix correspond to the first set of input registers and columns of the matrix correspond to the second set of input registers, a set of row control registers wherein each register corresponds to a row of the matrix of the comparator circuits, the matrix of comparator circuits configured to compare data provided by the first set of registers with data provided by the second set of registers according to the row control registers, and an error detection circuit configured to compare results from four comparator circuits corresponding to two adjacent rows and two columns of the matrix of comparator circuits. A method that invokes the above mentioned apparatus is also disclosed herein, along with a computer program product corresponding to the method.

20 Claims, 6 Drawing Sheets

(51) Int. Cl.
*G06F 11/07* (2006.01)
*G06F 11/10* (2006.01)
*G06F 17/16* (2006.01)
*H03K 19/20* (2006.01)
*H04L 12/939* (2013.01)

(52) U.S. Cl.
CPC ...... *G06F 11/0751* (2013.01); *G06F 11/1048* (2013.01); *G06F 17/16* (2013.01); *H03K 19/20* (2013.01); *H04L 49/555* (2013.01)

(56) References Cited

U.S. PATENT DOCUMENTS

| | | | | |
|---|---|---|---|---|
| 4,852,105 | A * | 7/1989 | Kurz | G11B 20/10527 714/822 |
| 5,161,230 | A * | 11/1992 | Carter | G06F 17/30985 707/700 |
| 5,199,035 | A | 3/1993 | Lopez et al. | |
| 5,586,288 | A | 12/1996 | Dahlberg | |
| 5,887,003 | A | 3/1999 | Ranson et al. | |
| 6,988,227 | B1 | 1/2006 | Perrott | |
| 8,188,761 | B2 | 5/2012 | Fleischer et al. | |
| 8,762,804 | B2 | 6/2014 | Shah et al. | |
| 9,389,955 | B1 * | 7/2016 | Cuffney | G06F 11/079 |
| 2004/0216016 | A1 | 10/2004 | Olaker | |
| 2004/0264696 | A1 * | 12/2004 | Cockburn | H03M 7/3084 380/200 |
| 2007/0011598 | A1 | 1/2007 | Hassner et al. | |
| 2008/0040638 | A1 | 2/2008 | Goessel et al. | |
| 2009/0024888 | A1 * | 1/2009 | Kurimoto | G01R 31/31858 714/731 |
| 2009/0315601 | A1 | 12/2009 | Priel et al. | |
| 2012/0155172 | A1 | 6/2012 | Watanabe et al. | |
| 2013/0246758 | A1 | 9/2013 | Bradbury et al. | |

FOREIGN PATENT DOCUMENTS

| | | |
|---|---|---|
| WO | 2005040839 A1 | 5/2005 |
| WO | 2013136232 A1 | 9/2013 |
| WO | 2013136233 A1 | 9/2013 |

OTHER PUBLICATIONS

IBM Appendix P, list of patents and patent applications treated as related, Dec. 29, 2015, pp. 1-2.
Drake et al., "Single-Cycle, Pulse-Shaped Critical Path Monitor in the POWER7+ Microprocessor", Symposium on Lower Power Electronics and Design, © 2013 IEEE, pp. 193-198.
Shalan et al., "Software control flow error detection and correlation with system performance deviation", Journal of Computer and System Sciences 80 (2014), pp. 953-972, © 2014 Elsevier Inc.
Cuffney et al., "String Dataflow Error Detection", U.S. Appl. No. 15/171,223, filed Jun. 2, 2016, 29 pages.
IBM Appendix P, list of IBM patents and patent applications treated as related, Jun. 2, 2016, 2 pages.

* cited by examiner

STRING DATAFLOW ERROR DETECTION

BACKGROUND OF THE INVENTION

The present invention relates generally to the field of electronic circuits and more particularly to circuits used for string comparison operations.

In high performance computing, being able to validate the correctness of a result is an important function. Frequently, these error detection methods need to be implemented within certain specific timing constraints, which introduces a need for a method that is both accurate and efficient. In some cases, these timing constraints are for the execution of the string comparison in addition to the error detection process. In those cases, having hardware that is capable of executing the string comparisons while simultaneously performing error detection makes it much easier to meet any required timing constraints.

SUMMARY

As disclosed herein, an apparatus for comparing strings includes a first and a second set of input registers, a matrix of comparator circuits wherein rows of the matrix correspond to the first set of input registers and columns of the matrix correspond to the second set of input registers, and a set of row control registers wherein each register corresponds to a row of the matrix of the comparator circuits. The matrix of comparator circuits may be configured to compare data provided by the first set of registers with data provided by the second set of registers according to the row control registers. The apparatus also includes an error detection circuit configured to compare results from four comparator circuits corresponding to two adjacent rows and two columns of the matrix of comparator circuits. A method that invokes the above mentioned apparatus is also disclosed herein. In one embodiment, the method includes calculating a results vector by conducting an AND operation on a row control vector provided by a row control register and an output vector of a comparator logic circuit. The method may also include conducting an XOR operation on a results vector from each of the four comparator circuits to provide an orthogonality bit indicating whether each results vector is orthogonal. The method may also include conducting an XOR operation, an OR operation, and an AND operation on the results vector from comparator circuits that share a common column to provide a first and a second truth vector. In one embodiment, the method includes conducting a parity operation on the first and the second truth vector to provide an error detection bit. A computer program product corresponding to the method is also disclosed herein.

DETAILED DESCRIPTION

Figure 1:
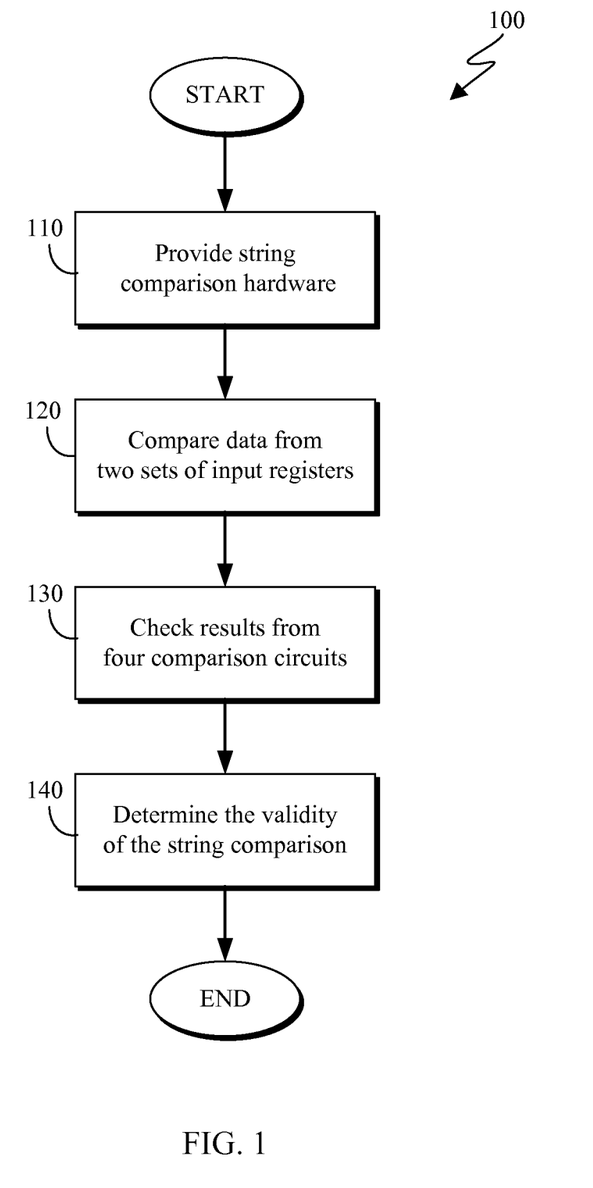
FIG. 1 is a flowchart depicting one embodiment of a string comparison error detection method in accordance with an embodiment of the present invention.

FIG. 1 is a flowchart depicting one embodiment of a string dataflow error detection method in accordance with an embodiment of the present invention. As depicted, the string dataflow error detection method includes providing (110) a string comparison circuit, comparing data (120) from two sets of input registers, checking results (130) from four comparator circuits, and determining (140) the validity of the string comparison. The depicted string dataflow error detection method can be implemented concurrently with the string comparison execution itself, making the method very time efficient.

Providing (110) a string comparison circuit may include providing any circuitry or other hardware that is used in the steps that follow. The hardware may include a first and second set of input registers, a matrix of comparator circuits, and a set of row control registers. The hardware is used to execute the string comparisons as well as carry out any logic functions used to check for errors in the strong comparisons.

Comparing data (120) from two sets of input registers may include using a hardware element to carry out a comparison function on data from two of the input registers. The data from the two input registers may go through a comparator logic circuit to provide an output vector indicating whether the data from the first input register is greater than, equal to, or less than the data from the second input register. The data comparison may occur according to the set of row control registers, wherein one of the row control registers indicates the relationship of interest selected from greater than, less than, and equal to. The output vector may be ANDed with a vector from the row control register to provide a results vector. Additionally, an XOR operation may be conducted on the results vector to provide an orthogonality bit. The orthogonality bit indicates whether or not the results vector is orthogonal.

Checking results (130) from four comparator circuits may include executing logic functions on results vectors from four comparator circuits in the matrix of comparator circuits. Checking results may include conducting an XOR operation, an OR operation, and an AND operation on the results vectors from comparator circuits that share a common column to provide a first and a second truth vector. In some embodiments, the results of the XOR operation, the OR operation, and the AND operation may be latched.

Determining (140) the validity of the string comparison may include conducting a parity operation on the first and the second truth vector to provide an error detection bit. The parity operation may be an XOR operation conducted on each bit of the first and the second truth vector to provide the error detection bit. In one embodiment, the error detection bit is latched, and a value of 1 indicates the presence of an error in the string comparison.

Figure 2:
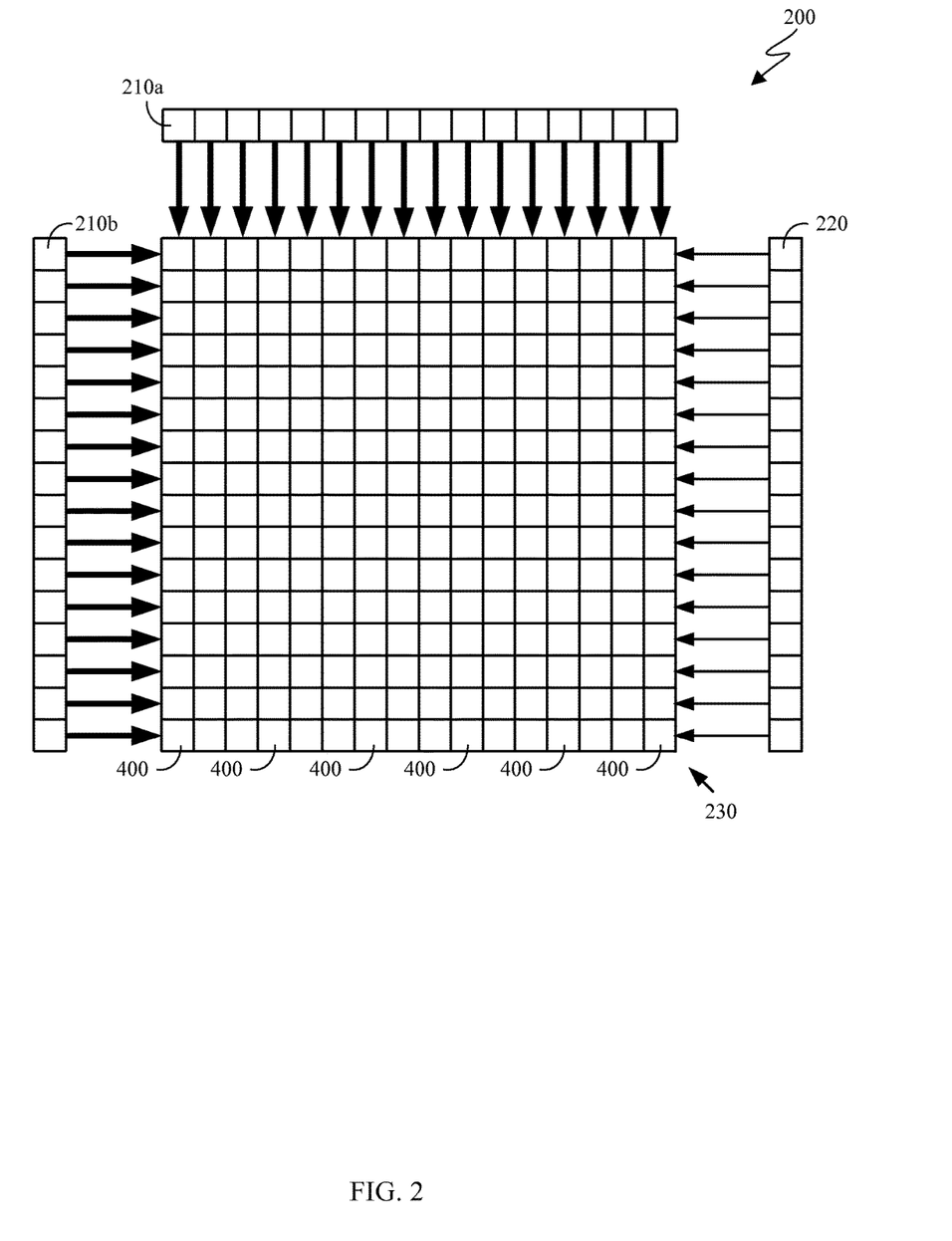
FIG. 2 is a schematic diagram depicting a string comparator circuit in accordance with an embodiment of the present invention.

FIG. 2 is a schematic diagram depicting a string comparison circuit 200 in accordance with an embodiment of the present invention. As depicted, the string comparison circuit 200 comprises two input registers 210*a*, 210*b*, a row control register 220, and a matrix of comparator circuits 230 comprising a plurality of comparator circuits 400. The string comparison circuit 200 may execute both a string comparison function and a parallel error detection method to check the dataflow.

Each input register 210a, 210b stores an operand that goes through a comparator circuit 400 as depicted. The arrows going from the input registers 210a, 210b to the matrix of comparator circuits 230 depict which bytes of each input operand are the subjects of comparison across each particular row and column in the matrix. The input registers 210a, 210b may also serve as (and be referred to as) input operands 210a, 210b.

The two input operands 210a and 210b may be data strings to be compared. In one embodiment, each string comprises 16 bytes of data. Input operands 210a and 210b are the strings that are fed through a comparator circuit to yield a matrix of comparison results. In one embodiment, the entries in the matrix of comparison results are 3 bit vectors indicating the relationship between a byte of input operand 210a and a byte of input operand 210b.

Row control register 220 may be a register containing a set of desired comparison operations (i.e. less than, equal to, and greater than comparison operations). In one embodiment, a bit of the row control register may be used to signify that the comparator circuits in the third row of the matrix of comparator circuits 230 should determine whether the two operands are equal. In the same embodiment, the next bit of the row control register may signify that the comparator circuits in the fourth row of the matrix of comparator circuits 230 should determine whether the two operands are equal and whether the first operand is greater than the second operand. The bits from this row control register may be ANDed with an output vector of the comparator logic circuit via the comparator circuit depicted in FIG. 4.

Figure 4:
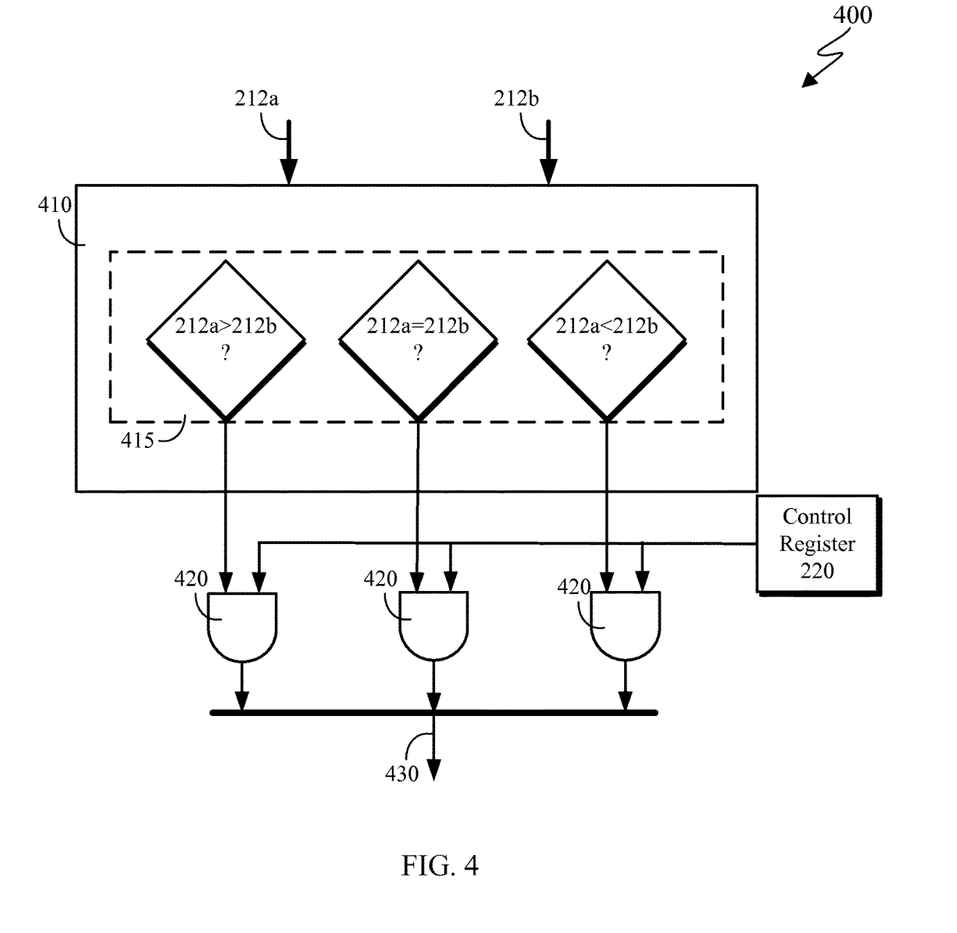
FIG. 4 is a schematic diagram depicting a comparator circuit in accordance with an embodiment of the present invention.

The matrix of comparator circuits 230 may be a hardware matrix comprising comparator circuits 400 corresponding to each comparison that is executed. Each comparator circuit 400 in the matrix executes a comparison for one entry in input operand 210a and one entry in input operand 210b. The comparator circuit 400 may execute the string comparisons necessary to calculate the results of the string compare instructions. In addition, the comparator circuit 400 may also be used in detecting an error in the string compare dataflow. FIG. 4 provides a more detailed depiction of one embodiment of the comparator circuit 400.

Figure 3:
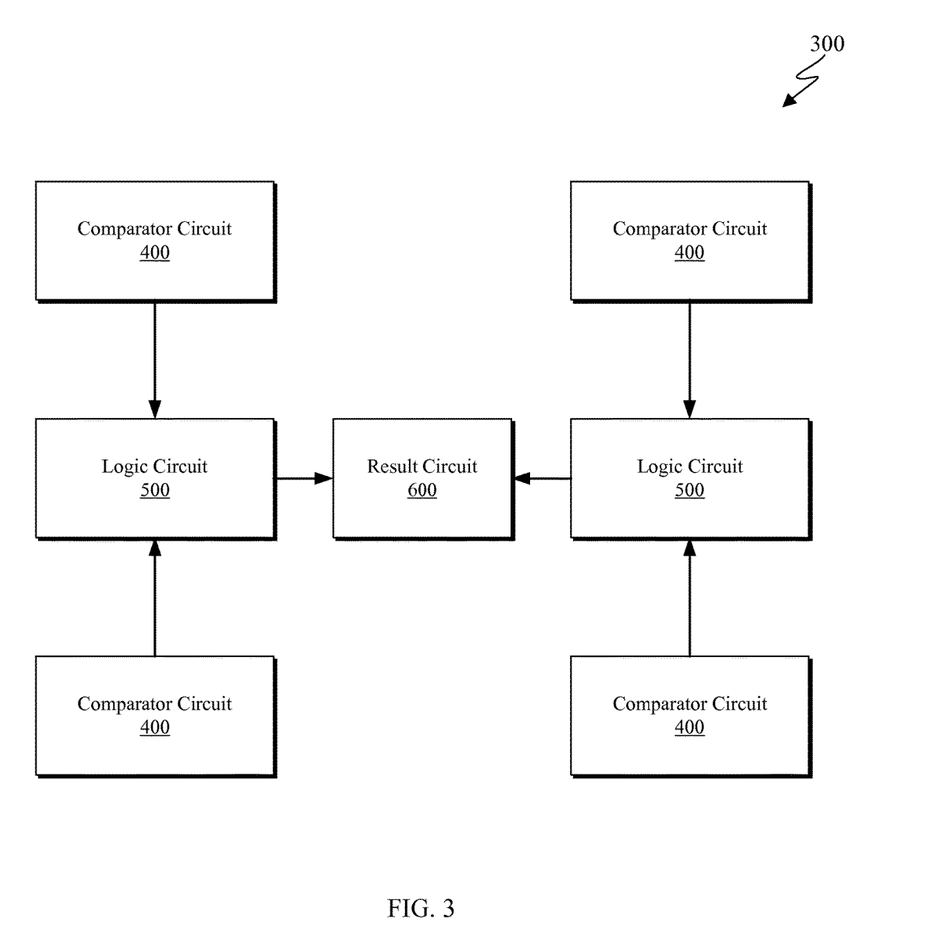
FIG. 3 is a block diagram depicting a string error detection circuit in accordance with one embodiment of the present invention.

FIG. 3 is a block diagram depicting an error detection circuit 300 in accordance with one embodiment of the present invention. As depicted, the error detection circuit 300 includes four comparator circuits 400, two logic circuits 500, and a result circuit 600. The comparator circuit 400 is the part of the error detection circuit 300 that executes the comparison between two bytes of the input operands and outputs a truth value depicting whether or not the two bytes exhibited the requested comparison relationship. The logic circuit 500 is the part of the error detection circuit 300 that executes additional Boolean logic on the outputs of comparator circuits 400 and stores the results to later be XORed with other results within the full error detection circuit 300. The result circuit 600 is the final piece of the error detection circuit 300 where the results from multiple logic circuits 500 are XORed together. These parts of the error detection circuit 300 are described in further detail in FIGS. 4-6.

FIG. 4 is a schematic diagram depicting one embodiment of the comparator circuit 400 in accordance with the present invention. As depicted, the comparator circuit includes comparator logic circuit 410, AND gates 420, and outputs 430 from the AND gates. The comparator circuit 400 may be used to receive and compare data provided by the input registers 210a and 210b depicted in FIG. 2. In one embodiment, each individual byte will go to all of the comparator circuits 400 within its row or column, such that each comparator circuit 400 within the matrix of comparator circuits 230 will carry out a comparison on a unique pair of bytes.

Comparator logic circuit 410 may comprise logic gates that take two numbers as input in binary form and determine whether one number is greater than, less than or equal to the other number. In the depicted embodiment, the comparator logic circuit 410 receives byte 212a and byte 212b as the two inputs to be compared. In the depicted embodiment, the output of this comparator logic circuit 410 is a 3 bit output vector A representing truth values for whether byte 212a is greater than, equal to, or less than byte 212b. Since only one of these things can be true, only one bit in the vector A can be equal to 1, and therefore vector A is orthogonal. The decision circuits 415 provide the determinations made by the comparator logic circuit 410.

The AND gates 420 may be AND gates used to AND the output vector of the comparator logic circuit 410 with the requested comparison relationship as indicated by the row control register 220. The AND gate will output a 1 if the bit from the control register and the output vector from the comparator circuit are both 1. Essentially, the AND gate is a check of whether or not the relationship between bytes 212a and 212b is what was expected. The three AND gates 420 in the depicted embodiment include one gate for each possible relationship between 212a and 212b; one gate ANDs the corresponding bit from the control register with the results for 212a>212b, one gate ANDs the corresponding bit from the control register with the results for 212a=212b, and one gate ANDs the corresponding bit from the control register with the result for 212a<212b. The outputs of these AND gates form a results vector, labeled 430, that is then sent to the logic circuit 500.

Figure 5:
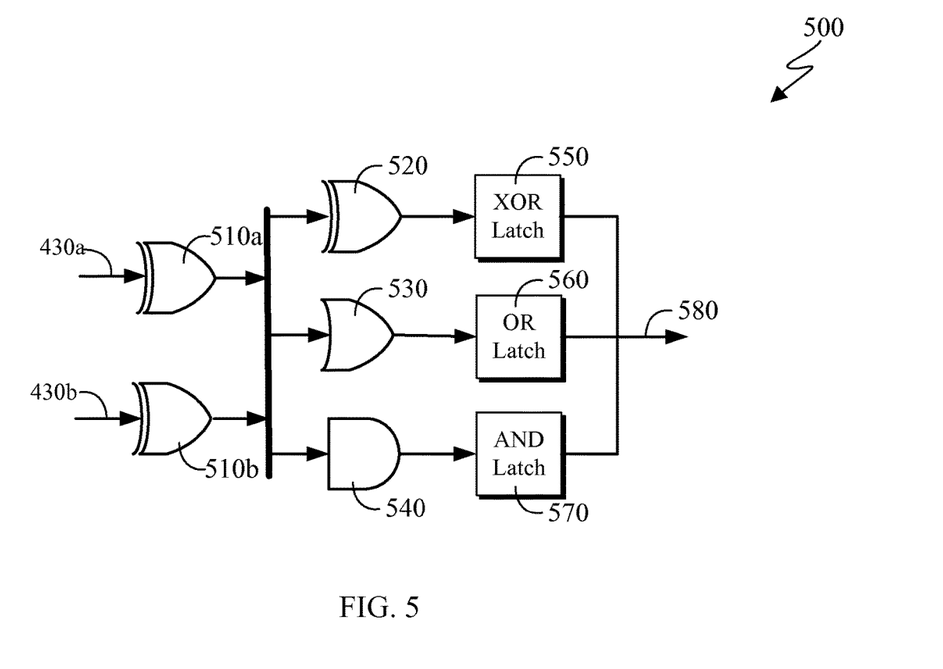
FIG. 5 is a schematic diagram depicting a logic circuit in accordance with an embodiment of the present invention.

FIG. 5 is a schematic diagram depicting an embodiment of the logic circuit 500 in accordance with the present invention. As depicted, the logic circuit 500 includes XOR gates 510a, 510b, an XOR gate 520, an OR gate 530, an AND gate 540, a latch 550 corresponding to the XOR gate 520, a latch 560 corresponding to the OR gate 530, and a latch 570 corresponding to the AND gate 540. The values in these latches correspond to an output vector 580, which is used as an input of the result circuit 600.

The XOR gates 510a, 510b may be XOR gates used to XOR the results vectors 430a and 430b from different comparator circuits. In short, the XOR gates verify that one and only one of the outputs from the AND gates 420 is true (i.e. 1). This serves as a check that of the possible relationships 212a>212b, 212a=212b, and 212a<212b, only one is true, which should always be the case. These XOR gates effectively serve as an orthogonality check for the output from the comparator circuit 400 for any requested comparison operation. The output of these XOR gates, called an orthogonality bit, may also be referred to as $T_{ij}$, where T indicates the truth value (0 or 1) of the XOR function for the comparison of the $i^{th}$ entry of 210a and the $j^{th}$ entry of 210b.

From this point, the orthogonality bits resulting from the XOR gates 510a, 510b may follow three paths. The orthogonality bits may be XORed through the XOR gate 520, ORed through the OR gate 530, or ANDed through the AND gate 540. In one embodiment, these logic gates are a part of the string comparison function as well as a part of the error detection method. In each case, the result is then stored by the depicted latches 550, 560, or 570. Finally, the outputs 580, called truth vectors, may be sent to the result circuit 600.

Figure 6:
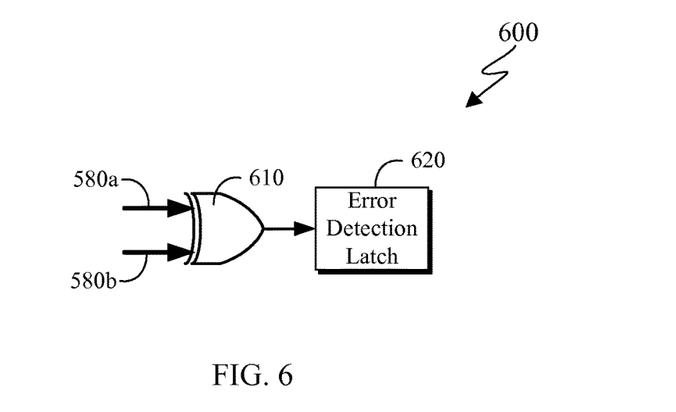
FIG. 6 is a schematic diagram depicting a circuit in accordance with an embodiment of the present invention.

FIG. 6 is a schematic diagram depicting the result circuit 600. As depicted, the result circuit 600 includes an XOR gate 610 and an error detection latch 620. In one embodiment, the XOR gate 610 receives the truth vectors 580a, 580b from multiple logic circuits 500 and XOR's them into the error detection latch 620. In one embodiment, the truth vectors 580a and 580b correspond to pairs of comparator circuits that are separated by at least n columns, where n is the number of columns corresponding to a largest element size for the string comparison operations. By XORing the truth vectors 580a and 580b, the need to calculate and latch the parity of the row control register B to detect an error is eliminated, thus eliminating unnecessary hardware and increasing the efficiency of the apparatus. In one embodiment, a 1 in the error detection latch 620 indicates that an error has been detected in the preceding string comparison.

FIGS. 2-6 depict a hardware implementation of a method for string comparison and simultaneous error detection. As is depicted, the hardware relies heavily on sequential logic. The following is a description of why the depicted logic sequences are indeed adequate for detecting errors in a string comparison.

The dataflow, a matrix of comparisons, begins with multiple input operands, call them X, Y, and B for this embodiment, where X corresponds to a byte of an input register 210a, Y corresponds to a byte of an input register 210b, and B corresponds to a control register 220. The desired result is to compare various element sizes from input operands 210a and 210b based on the bits from B, which indicates the relationship of interest to compare against the output of the comparator A.

The following equations describe how the complete dataflow is checked, with A representing the comparator logic output (a three bit vector indicating the mathematical relationship between X and Y), and B representing the three bit control vector indicating the relationship of interest between X and Y. The notation P[Z] used throughout the following equations refers to the parity of Z.

$$P[Z]=Z_0 \oplus Z_1 \oplus \ldots \oplus Z_{N-1} \quad (1)$$

where Zn is the $n^{th}$ bit of the binary vector Z, resulting in the following when bit vectors A and B are of length 3 (i.e., A(0:2) and B(0:2)).

$$P[AB]=(A_0 \cdot B_0) \oplus (A_1 \cdot B_1) \oplus (A_2 \cdot B_2) \quad (2)$$

$$P[A+B]=(A_0+B_0) \oplus (A_1+B_1) \oplus (A_2+B_2) \quad (3)$$

It can be assumed that A(0:2) is orthogonal. A(0:2) is the output of a comparator circuit, with inputs $X_i$ and $Y_j$, that determines whether $X_i$ is greater than, equal to, or less than $Y_j$. Since occurrences of a number being equal to, greater than, or less than another number are mutually exclusive events (i.e. one being true means the other two must be false), only one of the comparator circuit outputs can be 1. Therefore, the expectation is that A(0:2) will be orthogonal. The following equations are valid if the output of the comparator is orthogonal, and can therefore serve as a separate orthogonality check on A.

$$P[A]=1 \quad (4)$$

Because bit vector A is assumed to be orthogonal, one and only one bit will be 1, which indicates that the parity of A (represented as P[A]) will also be 1.

Bit vector B is expected to be the same across rows because B represents the controls for the compares and those controls are architecturally set to be the same. In other words, all the B values for a specific row stem from the same latch, which is reflected in the following equations which are used to derive a formula for detecting errors in the dataflow:

$$T_{ij}=A_{ij0} \cdot B_{ij0}+A_{ij1}B_{ij1}+A_{ij2}B_{ij2} \quad (5)$$

$T_{ij}$ is used further in the hardware logic cone contributing to the result for several instructions. These T values are used on the various element size boundaries the data flow supports. The notation of $T_{ij}$ corresponds to the matrix of compare circuits in the dataflow so subscript ij references the compare circuit that processes the string data corresponding to row i and column j. The T values may be referenced in hexadecimal and in one embodiment they range from $T_{00}$ to $T_{FF}$.

The following equations are used to relate Equation (2) with Equation (5).

$$P[A_{ij}] \oplus P[B_{ij}]=1 \oplus P[B_{ij}]=\mathrm{INV}(P[B_{ij}]) \quad (6)$$

Expecting that $P[A_{ij}]=1$, this simplifies the left half of Equation (2) so that $P[A_{ij}]$ does not need to be calculated and latched leading to:

$$P[A \cdot B]=A_{ij0} \cdot B_{ij0} \oplus A_{ij1} \cdot B_{ij1} \oplus A_{ij2} \cdot B_{ij2}=A_{ij0} \cdot B_{ij0}+ A_{ij1} \cdot B_{ij1}+A_{ij2} \cdot B_{ij2}=T_{ij}=P[T_{ij}] \quad (7)$$

Equation (7) holds true when A is orthogonal because two of the three XOR terms will be 0 leaving only one indeterminate term. All of the $T_{ij}$ values are 1 bit in length and this is why the value of $T_{ij}$ is equivalent to the $P[T_{ij}]$. This is also used in Equations (10), (12), and (13).

$$P[T_{ij}]=P[A_{ij} \cdot B_{ij}]=\mathrm{INV}(P[B_{ij}]) \oplus P[A_{ij}+B_{ij}] \quad (8)$$

$$P[T_{ij'}]=P[A_{ij'} \cdot B_{ij'}]=\mathrm{INV}(P[B_{ij'}]) \oplus P[A_{ij'}+B_{ij'}] \quad (9)$$

$$P[T_{ij}] \oplus P[T_{ij'}]=P[T_{ij} \cdot T_{ij'}] \oplus P[T_{ij}+T_{ij'}] \quad (10)$$

where subscript j' is equal to j XOR 1. Equation (10) follows from Equation (2) as applied to the results of the compares. This equation will hold true for all pairs of $T_{ij}$ and $T_{ij'}$.

$$P[T_{ij}] \oplus P[T_{ij'}] \oplus P[T_{ij} \cdot T_{ij'}] \oplus P[T_{ij}+T_{ij'}]=0 \quad (11)$$

Anything XORed with itself is equal to 0. From Equation (10) we know that the two sides are equal and when XORed will give a result of 0. This sets up a final equation with three distinct pieces that can be used to check each other. All three of these pieces are activated for all instructions that are running through the compare block as a parity check with 1 bit of parity on the element size of the compare.

$$P[T_{ij}T_{ij'}]=T_{ij} \cdot T_{ij'} \quad (12)$$

$$P[T_{ij}+T_{ij'}]=T_{ij}+T_{ij'} \quad (13)$$

$$P[A_{ij}+B_{ij}]=(A_{ij0}+B_{ij0}) \oplus (A_{ij1}+B_{ij1}) \oplus (A_{ij2}+B_{ij2}) \quad (14)$$

$$P[A_{ij}+B_{ij}]=(A_{ij0}+B_{ij0})(\text{not } A_{ij1})(\text{not } A_{ij2})(\text{not } B_{ij1})(\text{not } B_{ij2})+(A_{ij1}+B_{ij1})(\text{not } A_{ij0})(\text{not } A_{ij2})(\text{not } B_{ij1})(\text{not } B_{ij2})+(A_{ij2}+B_{ij2})(\text{not } A_{ij0})(\text{not } A_{ij1})(\text{not } B_{ij0})(\text{not } B_{ij1})+A_{ij0}B_{ij1}B_{ij2}+A_{ij1}B_{ij0}B_{ij2}+A_{ij2}B_{ij0}B_{ij1}+A_{ij0}A_{ij1}B_{ij2}+A_{ij0}A_{ij2}B_{ij1}+A_{ij1}A_{ij2}B_{ij0}+A_{ij0}A_{ij1}A_{ij2}+B_{ij0}B_{ij1}B_{ij2} \quad (15)$$

This is an unsimplified version of $P[A_{ij}+B_{ij}]$. To simplify this equation we continue with the assumption that $A_{ij}$ is orthogonal:

$$P[A_{ij}+B_{ij}]=A_{ij0}(B_{ij1} \text{ XNOR } B_{ij2})+A_{ij1}(B_{ij0} \text{ XNOR } B_{ij2})+A_{ij2}(B_{ij0} \text{ XNOR } B_{ij1}) \quad (16)$$

In this dataflow, the timing critical path is along paths that use the output of the comparator which is vector A. Since this is the timing critical path, being able to simplify combinational logic utilizing A is important in this dataflow.

From here the equations that follow simplify the logic required for the checking method.

$$P[T_{ij}] \oplus P[T_{ij'}] = \text{INV}(P[B_{ij}]) \oplus P[A_{ij}+B_{ij}] \oplus \\ \text{INV}(P[B_{ij'}]) \oplus P[A_{ij'}+B_{ij'}] \quad (17)$$

The complete check listed in Equation (17) may be implemented without simplification due to any assumptions, including the orthogonality of A. In some scenarios, the complete check may be implemented within the timing constraints of the string compare operation. In other situations however, it may not be feasible to carry out the full check within the timing constraints, making further simplification of the method necessary.

The following calculations may be used to provide a further simplified solution. With the calculation of the parity of B, Equation (17) would have all of the necessary information but additional simplifications can be made that eliminate the need to calculate the parity of B. This next simplification stems from the assumption that B's on the same row are expected to be equal.

$$P[B_{00}] = P[B_{10}] = P[B_{20}] = \ldots = P[B_{F0}] \quad (18)$$

Since B's on the same row are equal, taking two columns and combining them into a single equation would leave a situation where the INV(P[B]) will cancel out. Since this dataflow supports various element sizes and because results for larger element sizes are replicated into multiple adjacent result latches, the INV(P[B])'s that are chosen need to be separated by the greatest element size that is supported so that errors don't end up canceling each other. The following two equations are shown with a byte implementation such that the column that is chosen is directly next to the current column. From Equation (11) taking two columns next to each other and combining the equations leaves:

$$P[T_{ij}] \oplus P[T_{ij'}] \oplus P[T_{i'j}] \oplus P[T_{i'j'}] \oplus P[T_{ij} \cdot T_{ij'}] \oplus P[T_{ij} + T_{ij'}] \oplus P[T_{i'j} \cdot T_{i'j'}] \oplus P[T_{i'j} + T_{i'j'}] = 0 \quad (19)$$

where subscript i' is equal to i XOR 1 and where subscript j' is equal to j XOR 1. Replacing $P[T_{ij}]$, $P[T_{ij'}]$, $P[T_{i'j}]$, $P[T_{i'j'}]$ from Equations (8) and (9) into Equation (19) gives:

$$P[A_{ij}+B_{ij}] \oplus P[A_{ij'}+B_{ij'}] \oplus P[A_{i'j}+B_{i'j}] \oplus P[A_{i'j'}+B_{i'j'}] \oplus P[T_{ij} \cdot T_{ij'}] \oplus P[T_{ij}+T_{ij'}] \oplus P[T_{i'j} \cdot T_{i'j'}] \oplus P[T_{i'j}+T_{i'j'}] = 0 \quad (20)$$

This equation will hold true for all four quadrants, namely $T_{ij}$, $T_{ij'}$, $T_{i'j}$ and $T_{i'j'}$. A hardware implementation can be constructed such that a nonzero value for Equation (20) indicates an error.

Figure 7:
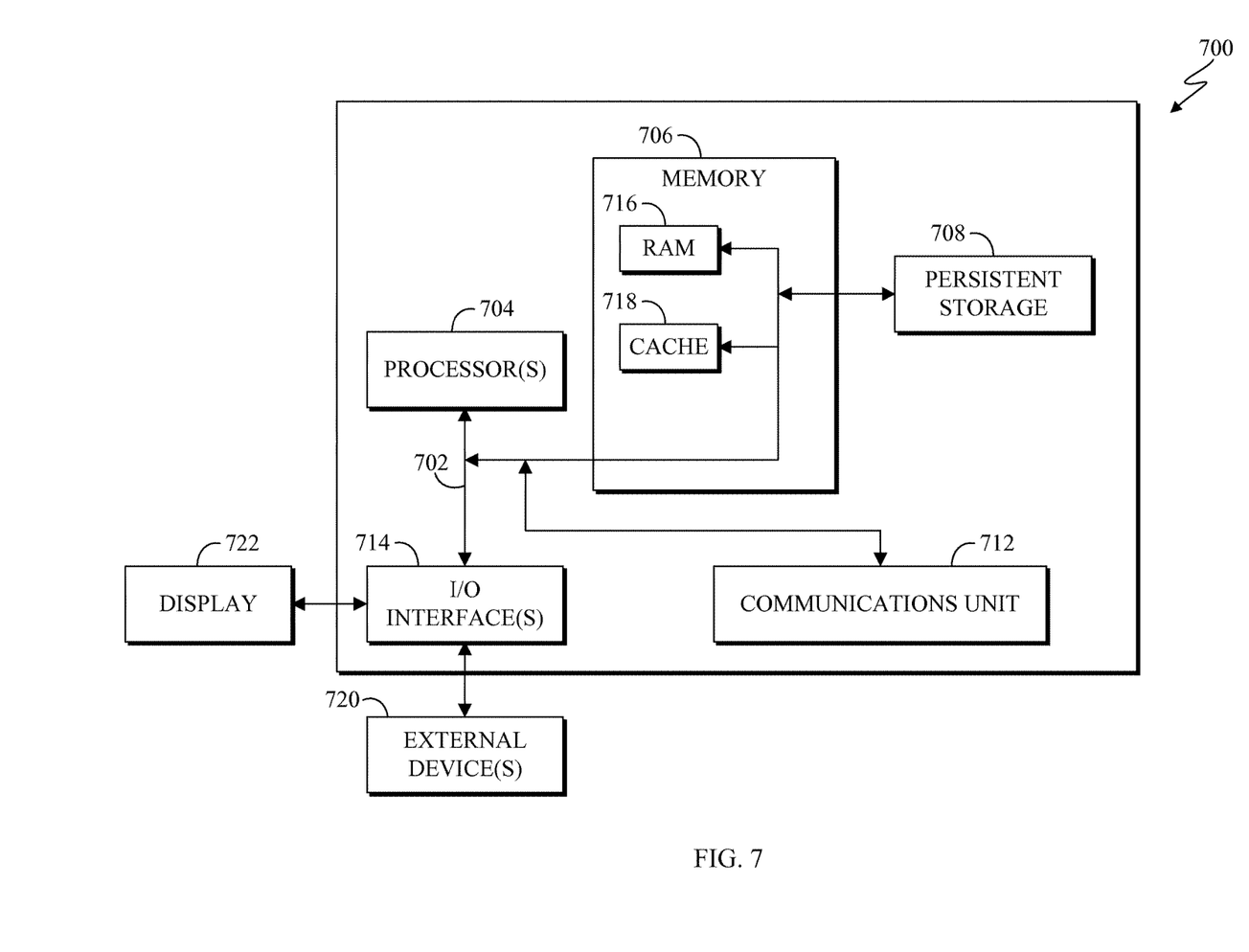
FIG. 7 depicts a block diagram of components of the server computer executing the program name, in accordance with an embodiment of the present invention.

FIG. 7 depicts a block diagram of components of computer 700 in accordance with an illustrative embodiment of the present invention. It should be appreciated that FIG. 7 provides only an illustration of one implementation and does not imply any limitations with regard to the environments in which different embodiments may be implemented. Many modifications to the depicted environment may be made.

As depicted, the computer 700 includes communications fabric 702, which provides communications between computer processor(s) 704, memory 706, persistent storage 708, communications unit 712, and input/output (I/O) interface(s) 714. Communications fabric 702 can be implemented with any architecture designed for passing data and/or control information between processors (such as microprocessors, communications and network processors, etc.), system memory, peripheral devices, and any other hardware components within a system. For example, communications fabric 702 can be implemented with one or more buses.

Memory 706 and persistent storage 708 are computer-readable storage media. In this embodiment, memory 706 includes random access memory (RAM) 716 and cache memory 718. In general, memory 706 can include any suitable volatile or non-volatile computer-readable storage media.

One or more programs may be stored in persistent storage 708 for access and/or execution by one or more of the respective computer processors 704 via one or more memories of memory 706. In this embodiment, persistent storage 708 includes a magnetic hard disk drive. Alternatively, or in addition to a magnetic hard disk drive, persistent storage 708 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 708 may also be removable. For example, a removable hard drive may be used for persistent storage 708. Other examples include optical and magnetic disks, thumb drives, and smart cards that are inserted into a drive for transfer onto another computer-readable storage medium that is also part of persistent storage 708.

Communications unit 712, in these examples, provides for communications with other data processing systems or devices. In these examples, communications unit 712 includes one or more network interface cards. Communications unit 712 may provide communications through the use of either or both physical and wireless communications links.

I/O interface(s) 714 allows for input and output of data with other devices that may be connected to computer 700. For example, I/O interface 714 may provide a connection to external devices 720 such as a keyboard, keypad, a touch screen, and/or some other suitable input device. External devices 720 can also include portable computer-readable storage media such as, for example, thumb drives, portable optical or magnetic disks, and memory cards. Software and data used to practice embodiments of the present invention can be stored on such portable computer-readable storage media and can be loaded onto persistent storage 708 via I/O interface(s) 714. I/O interface(s) 714 also connect to a display 722.

Display 722 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An apparatus for comparing strings, the apparatus comprising:
    a first and a second set of input registers;
    a matrix of comparator circuits wherein rows of the matrix correspond to the first set of input registers and columns of the matrix correspond to the second set of input registers;
    a set of row control registers wherein each register of the set of row control registers corresponds to a row of the matrix of comparator circuits;
    the matrix of comparator circuits configured to compare data provided by the first set of registers with data provided by the second set of registers according to the row control registers; and
    an error detection circuit configured to compare results from four comparator circuits of the matrix of comparator circuits, wherein the four comparator circuits correspond to two adjacent rows and two columns of the matrix of comparator circuits.

2. The apparatus of claim 1, wherein the error detection circuit is further configured to calculate a results vector by conducting an AND operation on a row control vector provided by a row control register and an output vector of a comparator logic circuit.

3. The apparatus of claim 1, wherein the error detection circuit is further configured to conduct an XOR operation which acts as an orthogonality check on a results vector from each of the four comparator circuits to provide an orthogonality bit for each of the four comparator circuits.

4. The apparatus of claim 2, wherein the error detection circuit is further configured to conduct an XOR operation, an OR operation, and an AND operation on the results vector from comparator circuits that share a common column to provide a first and a second truth vector.

5. The apparatus of claim 4, wherein the error detection circuit is configured to conduct a parity operation on the first and the second truth vector to provide an error detection bit.

6. The apparatus of claim 5, wherein the parity operation conducted by the error detection circuit is an XOR operation on each bit of the first and the second truth vector.

7. The apparatus of claim 1, wherein the two columns of the matrix of comparator circuits are separated by at least n columns, where n is the number of columns corresponding to a largest element size for string comparison operations.

8. The apparatus of claim 1, wherein each row control register of the set of row control registers is configured to indicate whether each of less than, equal to, and greater than comparisons are to occur within a row of the matrix of comparator circuits.

9. A method, executed by a computer, for detecting errors when comparing strings, the method comprising:
    providing a first and a second set of input registers;
    providing a matrix of comparator circuits wherein rows of the matrix correspond to the first set of input registers and columns of the matrix correspond to the second set of input registers;
    providing a set of row control registers wherein each register of the set of row control registers corresponds to a row of the matrix of comparator circuits;
    comparing data provided by the first set of input registers with data provided by the second set of input registers according to the set of row control registers with the matrix of comparator circuits;
    checking results from four comparator circuits of the matrix of comparator circuits wherein the four comparator circuits correspond to two adjacent rows and two columns of the matrix of comparator circuits; and
    determining validity of the data comparison.

10. The method of claim 9, wherein comparing data further comprises calculating a results vector for each comparator circuit by ANDing a row control vector provided by a row control register with an output vector of a comparator logic circuit.

11. The method of claim 10, wherein checking results from four comparator circuits further comprises conducting an XOR operation on the results vector which acts as an orthogonality check on the results vector to provide an orthogonality bit for the comparator circuit.

12. The method of claim 10, wherein checking results from four comparator circuits further comprises conducting an XOR operation, an OR operation, and an AND operation on the results vectors from comparator circuits that share a common column to provide a first and a second truth vector.

13. The method of claim 12, wherein determining the validity of the data comparison further comprises conducting a parity operation on the first and the second truth vector to provide an error detection bit.

14. The method of claim 13, wherein conducting a parity operation on the first and the second truth vector further comprises XORing each bit of the first and the second truth vector.

15. The method of claim 9, wherein the two columns of the matrix of comparator circuits are separated by at least n columns, where n is the number of columns corresponding to a largest element size for string comparison operations.

16. The method of claim 9, wherein each row control register of the set of row control registers indicates whether each of less than, equal to, and greater than comparisons are to occur within a row of the matrix of comparator circuits.

17. A computer program product for detecting errors when comparing strings, the computer program product comprising:
    one or more computer readable storage media and program instructions stored on the one or more computer readable storage media, the program instructions comprising instructions to:
    provide a first and a second set of input registers;
    provide a matrix of comparator circuits wherein rows of the matrix correspond to the first set of input registers and columns of the matrix correspond to the second set of input registers;
    provide a set of row control registers wherein each register of the set of row control registers corresponds to a row of the matrix of comparator circuits;
    compare data provided by the first set of input registers with data provided by the second set of input registers according to the set of row control registers;
    check results from four comparator circuits of the matrix of comparator circuits wherein the four comparator circuits correspond to two adjacent rows and two columns of the matrix of comparator circuits; and
    determine validity of the data comparison.

18. The computer program product of claim 17, wherein the program instructions to compare data further comprise instructions to calculate a results vector for each comparator circuit by ANDing a row control vector provided by a row control register with an output vector of a comparator logic circuit.

19. The computer program product of claim 18, wherein the program instructions to check results from four comparator circuits further comprise instructions to conduct an XOR operation on the results vector which acts as an orthogonality check on the results vector to provide an orthogonality bit for the comparator circuit.

20. The computer program product of claim 17, wherein the program instructions to determine the validity of the data comparison further comprise instructions to conduct a parity operation on a first and a second truth vector to provide an error detection bit.

* * * * *